(12) United States Patent
Li et al.

(10) Patent No.: US 10,986,866 B2
(45) Date of Patent: Apr. 27, 2021

(54) ELECTRONIC CIGARETTE LIQUID SUPPLY DEVICE AND METHOD

(71) Applicant: CHINA TOBACCO YUNNAN INDUSTRIAL CO., LTD, Kunming (CN)

(72) Inventors: Tinghua Li, Kunming (CN); Donglai Zhu, Kunming (CN); Deshou Mao, Kunming (CN); Yi Han, Kunming (CN); Shoubo Li, Kunming (CN); Xia Zhang, Kunming (CN); Xiaowei Gong, Kunming (CN); Wei Zhao, Kunming (CN)

(73) Assignee: CHINA TOBACCO YUNNAN INDUSTRIAL CO., LTD, Kunming (CN)

( * ) Notice: Subject to any disclaimer, the term of this patent is extended or adjusted under 35 U.S.C. 154(b) by 0 days.

(21) Appl. No.: 16/648,232

(22) PCT Filed: Oct. 12, 2019

(86) PCT No.: PCT/CN2019/110852
§ 371 (c)(1),
(2) Date: Mar. 18, 2020

(87) PCT Pub. No.: WO2020/108119
PCT Pub. Date: Jun. 4, 2020

(65) Prior Publication Data
US 2021/0015152 A1  Jan. 21, 2021

(30) Foreign Application Priority Data
Nov. 27, 2018  (CN) .......................... 201811427667.4

(51) Int. Cl.
*A24F 40/48*  (2020.01)
*A24F 40/05*  (2020.01)
(Continued)

(52) U.S. Cl.
CPC .............. *A24F 40/05* (2020.01); *A24F 40/10* (2020.01); *A24F 40/42* (2020.01); *A24F 40/48* (2020.01);
(Continued)

(58) Field of Classification Search
None
See application file for complete search history.

(56) References Cited

U.S. PATENT DOCUMENTS

2009/0314062 A1* 12/2009 Tsuyoshi ............... F04B 17/003
                                                                 73/53.01
2017/0280771 A1* 10/2017 Courbat ................ A24F 47/008

FOREIGN PATENT DOCUMENTS

CN         101360679 A      2/2009
CN         102196866 A      9/2011
(Continued)

*Primary Examiner* — Michael H. Wilson
*Assistant Examiner* — Katherine A Will
(74) *Attorney, Agent, or Firm* — Bayramoglu Law Offices LLC

(57) ABSTRACT

An electronic cigarette liquid supply device includes the piezoelectric substrate, the insulating film, the first interdigital transducer, the second interdigital transducer, the liquid storage chamber, the flow channel and the liquid outlet. A liquid inlet is provided on the liquid storage chamber. One end of the flow channel is hermetically connected to the liquid storage chamber, and the other end of the flow channel is the liquid outlet. The first interdigital transducer and the second interdigital transducer are attached to a surface of the piezoelectric substrate and located between the piezoelectric substrate and the insulating film. The liquid storage chamber, the flow channel and the liquid outlet are provided outside and above the insulating film.

20 Claims, 1 Drawing Sheet

(51) Int. Cl.
   *A24F 40/10* (2020.01)
   *A24F 40/42* (2020.01)
   *B05B 17/06* (2006.01)
   *F04B 17/00* (2006.01)
   *H03H 9/145* (2006.01)
   *H03H 9/25* (2006.01)

(52) U.S. Cl.
   CPC ........ *B05B 17/0661* (2013.01); *F04B 17/003* (2013.01); *H03H 9/14541* (2013.01); *H03H 9/25* (2013.01)

(56) References Cited

FOREIGN PATENT DOCUMENTS

| | | |
|---|---|---|
| CN | 106174706 A | 12/2016 |
| CN | 108030153 A | 5/2018 |
| CN | 108095200 A | 6/2018 |
| CN | 108158042 A | 6/2018 |
| CN | 109480334 A | 3/2019 |
| JP | 2015013234 A | 1/2015 |

\* cited by examiner

ELECTRONIC CIGARETTE LIQUID SUPPLY DEVICE AND METHOD

CROSS REFERENCE TO THE RELATED APPLICATIONS

This application is the national phase entry of International Application No. PCT/CN2019/110852, filed on Oct. 12, 2019, which is based upon and claims priority to Chinese Patent Application No. 201811427667.4, filed on Nov. 27, 2018, the entire contents of which are incorporated herein by reference.

TECHNICAL FIELD

The present disclosure relates to the technical field of electronic cigarettes, and particularly to an electronic cigarette liquid supply device and method.

BACKGROUND

Electronic cigarettes are an emerging product that can replace traditional cigarettes, and thus have a promising market prospect. However, a number of problems particularly including the atomization of electronic cigarettes and the supply of e-liquids need to be solved in order to meet the requirements of compartmentalization, portability, increased amount of smoke, and desired flavor. Though the atomization technology of electronic cigarettes has made remarkable progress in recent years, there is still a challenge in terms of providing a suitable amount of e-liquids for the atomization of electronic cigarettes within a restricted space, which can be essentially regarded as the design issue of micropumps.

Most of existing liquid supply devices such as piezoelectric and electromagnetic micropumps are large-scale external devices having large sizes and complicated control systems and thus have limited application. Generally, in order to achieve the purpose of being easy to carry, electronic cigarettes are small and, in most cases, too small to house existing micropumps. Moreover, traditional electronic cigarettes rely on the capillary action of wicks to supply the e-liquid during atomization. As a result, liquid supply is nonuniform or insufficient, which causes carbonization of the wicks and produces undesirable harmful substances such as carbon monoxide (CO). The passive liquid conduction accomplished by the capillary action of the wicks leads to an uncontrollable and unstable liquid conduction rate. When the liquid conduction rate is lower than the atomization rate, this can easily lead to insufficient atomization, which affects the smoking experience and even produces harmful components such as aldehydes, thus posing a potential health hazard. When the liquid conduction rate is greater than the atomization rate, the e-liquid not being atomized is likely to contaminate the device, which causes discomfort to the smoker and shortens the service life of the electronic cigarette.

The present disclosure is directed to this need.

SUMMARY

The present disclosure discloses an electronic cigarette liquid supply device suitable for electronic cigarettes that are small and easy to carry. This liquid supply device has a stable, uniform and controllable supply rate of the e-liquid in order to ensure optimal atomization effect.

The technical solution of the present disclosure is as follows.

The first aspect of the present disclosure discloses an electronic cigarette liquid supply device, including: the piezoelectric substrate 1, the insulating film 2 covering the piezoelectric substrate 1, the first interdigital transducer 31, the second interdigital transducer 32, the liquid storage chamber 4, the flow channel 5 and the liquid outlet 7.

The liquid inlet 6 is provided on the liquid storage chamber 4. One end of the flow channel 5 is hermetically connected to the liquid storage chamber 4, and the other end of the flow channel 5 is the liquid outlet 7.

The first interdigital transducer 31 and the second interdigital transducer 32 are attached to the surface of the piezoelectric substrate 1 and located between the piezoelectric substrate 1 and the insulating film 2. The liquid storage chamber 4, the flow channel 5 and the liquid outlet 7 are provided outside and above the insulating film 2.

The first interdigital transducer 31 is located beside the liquid storage chamber 4 along a direction opposite to the flow direction in the flow channel 5 and is not in contact with the liquid storage chamber 4. The second interdigital transducer 32 is located below the flow channel 5 between the liquid storage chamber 4 and the liquid outlet 7.

Preferably, the first interdigital transducer 31, the liquid storage chamber 4, the second interdigital transducer 32, the flow channel 5 and the liquid outlet 7 are linearly arranged relative to one another.

Preferably, the thickness of the insulating film 2 is between 200 nm-400 nm. The width of the flow channel 5 is 5-11 times the wavelength of the surface acoustic wave of the first interdigital transducer 31 and the second interdigital transducer 32, and the depth of the flow channel 5 is 2-5 times the wavelength of the surface acoustic wave. The liquid outlet 7 has a width of 1 mm to 10 mm and a height of 0.1 mm to 1.0 mm.

Preferably, the input signal used by the first interdigital transducer 31 and the input signal used by the second interdigital transducer 32 have the same frequency ranging from 100 MHz to 400 MHz. The power of the first interdigital transducer 31 is not less than the power of the second interdigital transducer 32.

Preferably, the first interdigital transducer 31 and the second interdigital transducer 32 both are gate electrodes formed by sputtering two metal films. The first metal film is made of titanium or chromium and has a thickness of 30 nm-100 nm. The second metal film is made of aluminum or gold and has a thickness of 100 nm-300 nm.

Preferably, the piezoelectric substrate 1 is at least one selected from the group consisting of quartz, a silicon wafer deposited with a zinc oxide film, piezoelectric ceramics, lithium niobate and lithium tantalite. The piezoelectric substrate 1 has a thickness of 0.3 mm to 1.5 mm, a temperature coefficient of $-100\times10^{-7}/°$ C. to $-30\times10^{-6}/°$ C., and an electromechanical coupling coefficient of 3.5%-8.5%. The propagation speed of the surface acoustic wave on the piezoelectric substrate 1 is 3950 m/s-4005 m/s. More preferably, the piezoelectric substrate 1 is made of a material having the orientation of Y-axis rotated 128.68° cut about the X-axis, and has a thickness of 0.5 mm, 1 mm, or 1.5 mm, an electromechanical coupling coefficient of 5.5%, and a temperature coefficient of $-72\times10^{-6}/°$ C. The propagation speed of the surface acoustic wave on the piezoelectric substrate 1 is 3985 m/s.

Preferably, the liquid storage chamber 4 and the flow channel are both made of polydimethylsiloxanes.

Preferably, the electronic cigarette liquid supply device further includes the radio frequency signal generator 8 that functions as a radio frequency power source, and the radio frequency signal generator 8 has a frequency range of 100 MHz-200 MHz and a power range of 0.1 W-1.5 W.

Preferably, the electronic cigarette liquid supply device further includes two sets of power feeding ports 9, and the two sets of power feeding ports 9 are provided on an outer side of the piezoelectric substrate 1 and configured to be connected to the radio frequency signal generator 8. One set of the two sets of power feeding ports 9 are connected to the first interdigital transducer 31 through the wire 10, and the other set of the two sets of power feeding ports 9 are connected to the second interdigital transducer 32 through the wire 10.

In another aspect of the present disclosure, there is provided a method for using the electronic cigarette liquid supply device described herein, which includes the following steps: activating the second interdigital transducer to generate a traveling surface acoustic wave on the upper surface of the piezoelectric substrate under the driving of a radio frequency signal to prevent the e-liquid in the liquid storage chamber from flowing to the liquid outlet; then, injecting an e-liquid into the liquid storage chamber from the liquid inlet; after the e-liquid is injected, activating the first interdigital transducer to generate a traveling surface acoustic wave on the upper surface of the piezoelectric substrate under the driving of the radio frequency signal to push the e-liquid in the liquid storage chamber to flow toward the liquid outlet; adjusting the output powers of the first interdigital transducer and the second interdigital transducer to allow a uniform flow of the e-liquid in the liquid storage chamber toward the liquid outlet to for a smoker's suction;

stopping the first interdigital transducer while keeping the second interdigital transducer, wherein the second interdigital transducer constantly works to push the e-liquid in the flow channel between the second interdigital transducer and the liquid storage chamber to flow into the liquid storage chamber; after the e-liquid in the flow channel between the second interdigital transducer and the liquid outlet flows out and is completely atomized, stopping the second interdigital transducer to complete the suction.

The advantages of the present disclosure include:

1. The electronic cigarette liquid supply device of the present disclosure adopts chip design, has a small size, low power consumption and high efficiency, and thus is suitable for electronic cigarettes, which require compartmentalization so they are easy to carry. The interdigital transducer and the e-liquid are separated by an insulating film to ensure the safety of the liquid supply and reduce the risk of short circuit, which is optimally safe and reliable.

2. In the electronic cigarette liquid supply device of the present disclosure, the first interdigital transducer on the piezoelectric substrate is configured to actively pump the e-liquid in the liquid storage chamber, and the flow direction and flow speed of the e-liquid are controlled by the second interdigital transducer. This ensures controllability and stability of the liquid conduction rate during the liquid supply process of the electronic cigarette. Additionally, the power of the interdigital transducer can be adjusted to control the liquid supply amount to ensure an accurate supply of the e-liquid in order to obtain a better atomization effect of the e-liquid and improve the atomization quality.

3. Additionally, in accordance with the method of the invention, the e-liquid is driven by the traveling surface acoustic wave generated by the interdigital transducer. As a result, the power necessary for performing this function is less than typically required and resulting heat is substantially reduced. Even when the device operates for a long time, the heat does not accumulate, which reduces the possibility of high temperature pyrolysis and production of harmful components like carbon monoxide (CO) and aldehydes, for example.

BRIEF DESCRIPTION OF THE DRAWINGS

Rather than limiting the present invention, the drawings that form a part of the specification are used to facilitate an understanding of the present disclosure and are intended to illustrate the present disclosure in conjunction with the embodiments disclosed. In the drawings.

Figure 1:
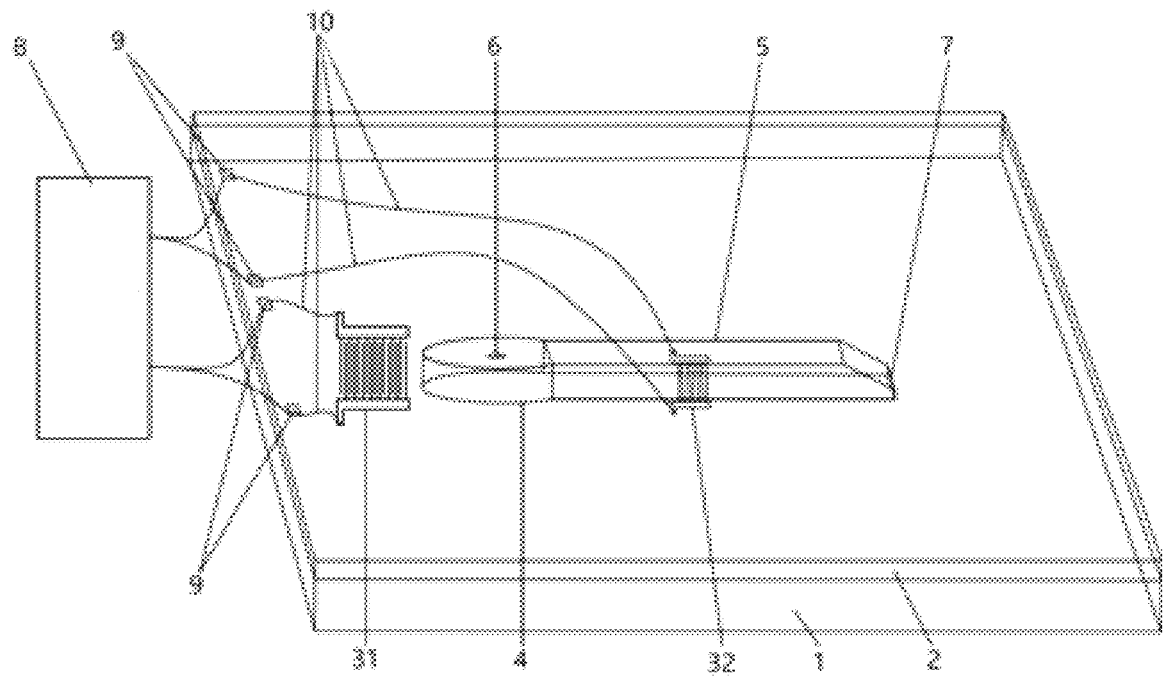
FIG. 1 is a structural schematic diagram of the electronic cigarette liquid supply device according to an embodiment of the present disclosure.

DESCRIPTION OF THE REFERENCE NUMERALS 1, piezoelectric substrate; 2, insulating film; 31, first interdigital transducer; 32, second interdigital transducer; 4, liquid storage chamber; 5, flow channel; 6, liquid inlet; 7, liquid outlet; 8, radio frequency signal generator; 9, power feeding port; 10, wire; 11, interdigital electrode; 12, busbar.

DETAILED DESCRIPTION OF THE EMBODIMENTS

The technical solutions of the present disclosure will be further described in detail hereinafter with reference to the drawings and embodiments.

Embodiments

In order to solve the problems in the prior art such as uncontrollable and unstable e-liquid supply that produces harmful substances and affects the flavor and quality, the embodiments of the present disclosure provide an e-liquid pumping device and method, which realizes non-contact active e-liquid pumping by the surface acoustic wave (SAW), and the pumping amount can be controlled and adjusted to achieve a stable and controllable e-liquid supply, thereby reducing harmful substances, improving the quality, and obtaining a better flavor.

An embodiment of the present disclosure provides an electronic cigarette liquid supply device that has the structure shown in FIG. 1. The electronic cigarette liquid supply device includes: the piezoelectric substrate 1, the insulating film 2, the first interdigital transducer 31, the second interdigital transducer 32, the liquid storage chamber 4, and the flow channel 5, wherein the first interdigital transducer 31 and the second interdigital transducer 32 are arranged between the piezoelectric substrate 1 and the insulating film 2, and the liquid storage chamber 4 and the flow channel 5 are arranged outside and above the insulating film 2.

The liquid inlet 6 is provided on the liquid storage chamber 4. One end of the flow channel 5 is hermetically connected to the liquid storage chamber 4, and the other end of the flow channel 5 is the liquid outlet 7.

The first interdigital transducer 31 and the second interdigital transducer 32 are attached to the surface of the piezoelectric substrate 1 and located between the piezoelectric substrate 1 and the insulating film 2. The liquid storage chamber 4, the flow channel 5 and the liquid outlet 7 are provided outside and above the insulating film 2.

The first interdigital transducer 31 is located beside the liquid storage chamber 4 along a direction opposite to the flow direction in the flow channel 5 and is not in contact with the liquid storage chamber 4. The second interdigital transducer 32 is located below the flow channel 5 between the liquid storage chamber 4 and the liquid outlet 7.

The first interdigital transducer 31 and the second interdigital transducer 32 are driven by the radio frequency signal to generate traveling surface acoustic waves to push the e-liquid in the liquid storage chamber 4 to flow toward the flow channel 5 and the liquid outlet 7 or retain the e-liquid in the liquid storage chamber 4.

The first interdigital transducer 31 and the second interdigital transducer 32 are provided between the piezoelectric substrate and the insulating film 2, and the insulating film 2 covers the surface of the piezoelectric substrate 1. Specifically, the first interdigital transducer 31 and the second interdigital transducer 32 use a micromachining process to sputter an interdigital metal film on the piezoelectric substrate 1 being polished.

The traveling surface acoustic wave excited by the first interdigital transducer 31 actively pumps the e-liquid stored in the liquid storage chamber 4 into the flow channel 5. The traveling surface acoustic wave excited by the second interdigital transducer 32 propagates toward both ends of the flow channel 5, respectively, to prevent the e-liquid in the liquid storage chamber 4 from flowing into the flow channel and pump the e-liquid in the liquid storage chamber 4 to the liquid outlet 7. The e-liquid is controlled to remain in the liquid storage chamber 4 or flow into the flow channel 5 and flow out from the liquid outlet 7 by controlling the working states of the first interdigital transducer 31 and the first interdigital transducer 32.

Center lines of the first interdigital transducer 31, the second interdigital transducer 32, the liquid storage chamber 4, and the flow channel 5 are arranged linearly relative to one another to form one line. The first interdigital transducer 31, the second interdigital transducer 32, the liquid storage chamber 4, and the flow channel 5 are closely attached to the surface of the piezoelectric substrate 1 vertically.

The piezoelectric substrate 1 is a piezoelectric material having the piezoelectric effect, and the material of the piezoelectric substrate 1 is at least one selected from the group consisting of quartz, a silicon wafer deposited with a zinc oxide film, piezoelectric ceramics, lithium niobate and lithium tantalite. The piezoelectric substrate 1 has a thickness of 0.3 mm-1.5 mm, a temperature coefficient of $-100 \times 10^{-7}/°$ C. to $-30 \times 10^{-6}/°$ C., and an electromechanical coupling coefficient of 3.5%-8.5%. The propagation speed of the surface acoustic wave on the piezoelectric substrate 1 is 3950 m/s-4005 m/s.

In one embodiment, the thickness of the piezoelectric substrate 1 is 1.5 mm, 1 mm, or 0.5 mm, the electromechanical coupling coefficient is 4.5%, 5.0%, 6.0%, 7.0%, or 7.5%, the temperature coefficient is $-72 \times 10^{-7}/°$ C., $-36 \times 10^{-7}/°$ C., $-36 \times 10^{-6}/°$ C., or $-72 \times 10^{-6}/°$ C., and the propagation speed is 3960 m/s, 3975 m/s, 3985 m/s, or 4000 m/s.

In the present embodiment, the piezoelectric substrate 1 is made of lithium niobate having the orientation of Y-axis rotated 128.68° cut about the X-axis, and has the thickness of 1 mm, the electromechanical coupling coefficient of 5.5%, and the temperature coefficient of $-72 \times 10^{-6}/°$ C. The propagation speed of the surface acoustic wave on the piezoelectric substrate 1 is 3985 m/s.

In the present embodiment, the material of the insulating film 2 is silicon dioxide, the thickness of the insulating film 2 is 250 nm. The insulating film 2 completely covers the entire surface of the piezoelectric substrate 1 and preferably covers the surface of the first interdigital transducer 31 and the surface of the second interdigital transducer 32. The insulating film 2 has two functions of minimizing the frictional resistance of the e-liquid in the flow channel 5 during the pumping process and preventing the interdigital transducer from contacting the e-liquid in the pipe, which can cause a short circuit.

The first interdigital transducer 31 and the second interdigital transducer 32 both include a gate electrode formed by sputtering two metal films. The first metal film is made of titanium and has the thickness of 50 nm. The second metal film is made of aluminum and has the thickness of 200 nm.

The resonance frequency range of the first interdigital transducer 31 and the second interdigital transducer 32 is 100 MHz-400 MHz. In the present embodiment, the input signal used by the first interdigital transducer 31 and the input signal used by the second interdigital transducer 32 have the same frequency of 100 MHz.

The liquid inlet 6 is provided above the liquid storage chamber 4. The flow channel 5 is provided with the liquid outlet 7. The liquid inlet 6 may be a small hole formed above the liquid storage chamber 4. The liquid inlet 7 is a narrow slit having the width of 5 mm and the height of 0.5 mm.

The liquid storage chamber 4 and the flow channel 5 may both a separate structure attached to the piezoelectric substrate 1, or may be combined with the piezoelectric substrate 1 to form one integrated structure. In the present embodiment, the liquid storage chamber 4 has a sealed e-liquid storage space, and the flow channel 5 has a sealed e-liquid channel. The liquid storage chamber 4 and the flow channel 5 are closely mounted on the surface of the piezoelectric substrate and are hermetically connected to form a sealed e-liquid channel.

The liquid storage chamber 4 and the flow channel 5 are both made of polydimethylsiloxanes.

The width of the flow channel can be designed according to the frequency of the interdigital transducer or the wavelength of the surface acoustic wave in order to obtain a better flow guiding effect. Based on a lot of experiments and research, it is better to design the flow channel to have a width equal to 5-11 times the wavelength of the surface acoustic wave, and a depth equal to 2-5 times the wavelength of the surface acoustic wave. In the present embodiment, when the frequency of the interdigital transducer is 100 MHz and the wave velocity of the surface acoustic wave is 4000 m/s, the flow channel 5 having the width of 280 μm and the depth of 80 μm reaches a better flow guiding effect.

The electronic cigarette liquid supply device further includes at least one radio frequency signal generator 8 configured to load radio frequency signals to the first interdigital transducer 31 and the second interdigital transducer 32.

The radio frequency signal generator 8 is a radio frequency power source. Alternatively, the radio frequency signal generator 8 includes a high-frequency signal source and a power amplifier connected to the high-frequency signal source. The frequency range of the high-frequency signal source is 100 MHz-200 MHz, and the power range of the high-frequency signal source is 0.1 W-1.5 W.

The radio frequency signal generator 8 transmits a signal to the first interdigital transducer 31 to excite the traveling SAW to actively pump the e-liquid stored in the liquid storage chamber 4 into the flow channel 5. The radio frequency signal generator 8 transmits a signal to the second interdigital transducer 32 to excite the traveling SAW which propagates to both ends of the flow channel 5, respectively, so as to prevent the e-liquid in the liquid storage chamber 4 from flowing into the flow channel, and pump the e-liquid in the liquid storage chamber 4 to the liquid outlet 7. When the radio frequency signal generator 8 stops transmitting the signal to the first interdigital transducer 31 and only transmits the signal to the second interdigital transducer 32, the SAW generated by the second interdigital transducer 32 propagates toward the liquid storage chamber 4 to prevent the e-liquid in the liquid storage chamber 4 from continuing to flow into the flow channel 5. The SAW generated by the second interdigital transducer 32 propagates toward the liquid outlet 7 to drive the e-liquid in the flow channel to completely flow out through the liquid outlet 7.

The electronic cigarette liquid supply device further includes two sets of power feeding ports 9, and the two sets of power feeding ports 9 are provided on the outer side of the piezoelectric substrate 1 and configured to be connected to the radio frequency signal generator 8. One set of the two sets of power feeding ports 9 are connected to the first interdigital transducer 31 through the wire 10, and the other set of the two sets of power feeding ports 9 are connected to the second interdigital transducer 32 through the wire 10. The power feeding port 9 is a connection port between the interdigital transducer and the radio frequency signal generator 8. The radio frequency signal generator 8 can be flexibly connected through the power feeding port 9 and can be disconnected at any time when not in use.

Figure 2:
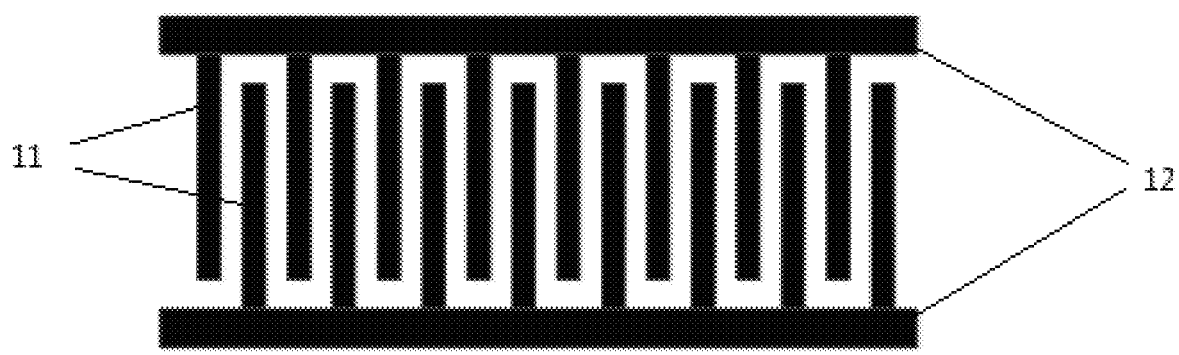
FIG. 2 is a structural schematic diagram of the interdigital transducer according to an embodiment of the present disclosure.

The power feeding port 9 is provided on the surface of the insulating film 2. The first interdigital transducer 31 and the second interdigital transducer 32 use different power feeding ports 9. A square opening having a side length of 0.8 mm is provided above the busbars 12 of the first interdigital transducer 31 and the second interdigital transducer 32 and configured to weld the wire 10. An example of the structure of the interdigital transducer is shown in FIG. 2. The interdigital electrodes 11 are staggered. The interdigital electrodes on each side are connected by a busbar, and the busbar is an electrode bar with a metal film and configured to collect electrical signals on the electrodes.

The wire is made of a metal material, and is preferably made of gold to minimize the loss. Other materials can also be used, e.g. copper, aluminum-iron alloy, nickel-iron alloy, and other conductive materials. In the present embodiment, gold wires are used.

The method of using the described electronic cigarette liquid supply device, includes the following steps. The second interdigital transducer is activated to generate a traveling SAW on the upper surface of the piezoelectric substrate under the driving of a radio frequency signal to prevent the e-liquid in the liquid storage chamber from flowing to the liquid outlet, and the e-liquid is injected into the liquid storage chamber though the liquid inlet; after the e-liquid is injected, the first interdigital transducer is activated to generate a traveling SAW on the upper surface of the piezoelectric substrate under the driving of the radio frequency signal to push the e-liquid in the liquid storage chamber to flow to the liquid outlet; the output power of the first interdigital transducer and the output power of the second interdigital transducer are adjusted to allow a uniform flow of the e-liquid in the liquid storage chamber to the liquid outlet, and the smoker can perform suction. Specifically, the radio frequency signal generator 8 is first activated to apply an alternating current signal to excite the second interdigital transducer 32; the second interdigital transducer generates a resonance between the electrodes by the input electrical signal through the inverse piezoelectric effect; the second interdigital transducer 32 transmits a series of surface acoustic waves to the liquid storage chamber 4 to effectively prevent the e-liquid in the liquid storage chamber 4 from flowing into the liquid channel 5. The e-liquid is injected into the liquid storage chamber 4 through the liquid inlet 6 until the e-liquid level is flush with the groove opening in the liquid storage chamber 4. The e-liquid would not flow automatically under standard atmospheric pressure due to the effect of surface acoustic waves, the surface tension of the e-liquid and the viscosity of the inner wall of the flow channel 5. The radio frequency signal generator 8 is activated to apply a second alternating current signal to excite the first interdigital transducer 31, and the gain of the radio frequency signal generator 8 is adjusted, to make the output power of the first interdigital transducer 31 equal to the output power of the second interdigital transducer 32. At this time, the acoustic streaming force received by the e-liquid at the interface between the liquid storage chamber 4 and the flow channel 5 is in equilibrium, and the e-liquid would not flow out. The output power of the first interdigital transducer 31 is gradually increased and the output power 32 of the second interdigital transducer is decreased until the e-liquid slowly flows into the flow channel 5 from the liquid storage chamber 4. The output power of the first interdigital transducer 31 continues to be increased. At this time, a pressure difference is formed at the interface between the flow channel 5 and the liquid storage chamber 4, and the initial equilibrium pressure field is broken. The flow rate of the e-liquid at the liquid outlet can be accurately controlled by controlling the powers of the first interdigital transducer 31 and the second interdigital transducer 32, so as to achieve an accurate control of the liquid conduction rate to ensure the continuous and stable atomization of the e-liquid.

When it is desirable to end a smoking session, the first interdigital transducer is stopped while the second interdigital transducer keeps working to push the e-liquid in the flow channel between the second interdigital transducer and the liquid storage chamber to flow into the liquid storage chamber. After the e-liquid in the flow channel between the second interdigital transducer and the liquid outlet flows out and is completely atomized, the second interdigital transducer is stopped, and the smoking is ended. Specifically, the input signal of the first interdigital transducer 31 is closed, and the second interdigital transducer 32 continues to operate, so that a reverse pressure difference is formed at the interface between the liquid storage chamber 4 and the flow channel 5, and thus the e-liquid cannot flow out from the interface. Meanwhile, after the remaining e-liquid in the flow channel 5 flows out through the liquid outlet 7 and is completely atomized, the second interdigital transducer is stopped, and the smoking ends.

In the above-mentioned device and method according to the embodiment of the present disclosure, the unique advantages of the surface acoustic wave technology are organically combined with the functions and characteristics of the electronic cigarette. In addition, a non-contact SAW electronic cigarette liquid supply device is provided based on the acoustic streaming coupling effect of surface acoustic waves and the propagation mechanism of Rayleigh waves, which effectively reduces the risk of wick carbonization due to the rapid heating caused by insufficient e-liquid supply and diminishes the risk of producing unhealthy substances due to the incomplete atomization. This non-contact SAW electronic cigarette liquid supply device has a high efficiency and low consumption, and is highly integrated, small in size and easy to carry, which reasonably solves the problem of active pumping of existing electronic cigarette liquid supply, and is more accurate in terms of the liquid supply. The e-liquid guiding rate can be controlled to one microliter per hour, and this device has an ultra-long service life and thus is cost-effective, and has a high safety factor.

The device and method of the embodiment of the present disclosure have the following advantages:

1. The SAW can drive the e-liquid by generating the traveling SAW without contact. The driving power is generally 0.1 W-1.5 W, which results in a small amount of heat. Even when the device operates for a long time, heat will not accumulate, which reduces the possibility of high temperature pyrolysis. Therefore, the driving of the SAW improves safety and uses less energy.

2. The entire device is completely chip-based and highly integrated on the surface of one chip, which compartmentalizes the size of the device creating additional space for the electronic cigarette. Moreover, the second interdigital transducer provided at the bottom of the flow channel can control the on-off of the e-liquid supply without the use of complicated microvalves.

3. The liquid storage chamber and the narrow slit-shaped liquid outlet are integrated based on the acoustic streaming coupling effect of surface acoustic waves. The traveling surface acoustic wave generated by the first interdigital transducer provides a driving force to achieve the active pumping, and the liquid guiding rate of the e-liquid is accurately controlled by adjusting the driving power. This ensures continuous and stable pumping and sufficient atomization of the e-liquid and avoid the occurrence of dry burning. Moreover, the accurate supply of the e-liquid also improves the atomization efficiency of the e-liquid and thus improves the quality and flavor during smoking.

The foregoing descriptions are only preferred embodiments of the present disclosure, and are not intended to limit the present disclosure. Those skilled in the art can understand that any modifications, equivalent replacements and improvements made according to the technical solution or technical features disclosed in the present disclosure without creative efforts shall fall within the scope of protection afforded the present disclosure.

What is claimed is:

1. An electronic cigarette liquid supply device, comprising:
    a piezoelectric substrate,
    an insulating film,
    a first interdigital transducer,
    a second interdigital transducer,
    a liquid storage chamber,
    a flow channel, and
    a liquid outlet;
    wherein
    the insulating film covers the piezoelectric substrate;
    a liquid inlet is provided on the liquid storage chamber; a first end of the flow channel is hermetically connected to the liquid storage chamber, and a second end of the flow channel is the liquid outlet;
    the first interdigital transducer and the second interdigital transducer are attached to a surface of the piezoelectric substrate and located between the piezoelectric substrate and the insulating film; the liquid storage chamber, the flow channel and the liquid outlet are provided outside and above the insulating film; and
    the first interdigital transducer is located beside the liquid storage chamber along a direction opposite to a flow direction in the flow channel and the first interdigital transducer is not in contact with the liquid storage chamber; the second interdigital transducer is located below the flow channel between the liquid storage chamber and the liquid outlet.

2. The electronic cigarette liquid supply device according to claim 1, wherein, the first interdigital transducer, the liquid storage chamber, the second interdigital transducer, the flow channel and the liquid outlet are linearly arranged relative to one another.

3. The electronic cigarette liquid supply device according to claim 2, wherein, the first interdigital transducer and the second interdigital transducer are both gate electrodes formed by sputtering two metal films; a first metal film of the two metal films is made of titanium or chromium and has a thickness of 30 nm-100 nm; and a second metal film of the two metal films is made of aluminum or gold and has a thickness of 100 nm-300 nm.

4. The electronic cigarette liquid supply device according to claim 2, wherein, the liquid storage chamber and the flow channel are both made of polydimethylsiloxanes.

5. The electronic cigarette liquid supply device according to claim 1, wherein, a thickness of the insulating film is 200 nm-400 nm; a width of the flow channel is 5-11 times a wavelength of a surface acoustic wave of the first interdigital transducer and is 5-11 times a wavelength of a surface acoustic wave of the second interdigital transducer; a depth of the flow channel is 2-5 times the wavelength of the surface acoustic wave of the first interdigital transducer and is 2-5 times the wavelength of the surface acoustic wave of the second interdigital transducer; and a width of the liquid outlet is 1 mm-10 mm, and a height of the liquid outlet is 0.1 mm-1.0 mm.

6. The electronic cigarette liquid supply device according to claim 5, wherein, the first interdigital transducer and the second interdigital transducer are both gate electrodes formed by sputtering two metal films; a first metal film of the two metal films is made of titanium or chromium and has a thickness of 30 nm-100 nm; and a second metal film of the two metal films is made of aluminum or gold and has a thickness of 100 nm-300 nm.

7. The electronic cigarette liquid supply device according to claim 1, wherein, an input signal used by the first interdigital transducer and an input signal used by the second interdigital transducer have one frequency, and the one frequency ranges from 100 MHz to 400 MHz.

8. The electronic cigarette liquid supply device according to claim 7, wherein, the first interdigital transducer and the second interdigital transducer are both gate electrodes formed by sputtering two metal films; a first metal film of the two metal films is made of titanium or chromium and has a thickness of 30 nm-100 nm; and a second metal film of the two metal films is made of aluminum or gold and has a thickness of 100 nm-300 nm.

9. The electronic cigarette liquid supply device according to claim 1, wherein, the first interdigital transducer and the second interdigital transducer are both gate electrodes formed by sputtering two metal films; a first metal film of the two metal films is made of titanium or chromium and has a thickness of 30 nm-100 nm; and a second metal film of the two metal films is made of aluminum or gold and has a thickness of 100 nm-300 nm.

10. The electronic cigarette liquid supply device according to claim 1, wherein, the piezoelectric substrate is at least one selected from the group consisting of quartz, a silicon wafer deposited with a zinc oxide film, piezoelectric ceramics, lithium niobate and lithium tantalite; the piezoelectric substrate has a thickness of 0.3 mm-1.5 mm, a temperature coefficient of $-100 \times 10^{-7}/°$ C.-$30 \times 10^{-6}/°$ C., and an electromechanical coupling coefficient of 3.5%-8.5%; a propagation speed of a surface acoustic wave on the piezoelectric substrate is 3950 m/s-4005 m/s.

11. The electronic cigarette liquid supply device according to claim 1, wherein, the liquid storage chamber and the flow channel are both made of polydimethylsiloxanes.

12. The electronic cigarette liquid supply device according to claim 1, further comprising a radio frequency signal generator, wherein the radio frequency signal generator is a radio frequency power source, and the radio frequency signal generator has a frequency range of 100 MHz-200 MHz and a power range of 0.1 W-1.5 W.

13. The electronic cigarette liquid supply device according to claim 1, further comprising two sets of power feeding ports, wherein the two sets of power feeding ports are provided on an outer side of the piezoelectric substrate and configured to be connected to a radio frequency signal generator; a first set of the two sets of power feeding ports are connected to the first interdigital transducer through a first wire, and a second set of the two sets of power feeding ports are connected to the second interdigital through a second wire.

14. An electronic cigarette liquid supply method using the electronic cigarette liquid supply device according to claim 1, comprising the following steps:
  activating the second interdigital transducer to generate a traveling surface acoustic wave on an upper surface of the piezoelectric substrate under a driving of a radio frequency signal to prevent a first e-liquid in the liquid storage chamber from flowing toward the liquid outlet; injecting a second e-liquid into the liquid storage chamber via the liquid inlet; after the second e-liquid is injected, activating the first interdigital transducer to generate a traveling surface acoustic wave on the upper surface of the piezoelectric substrate under the driving of the radio frequency signal to push the first e-liquid and the second e-liquid in the liquid storage chamber to flow to the liquid outlet; adjusting an output power of the first interdigital transducer and an output power of the second interdigital transducer to allow a uniform flow of the first e-liquid and the second e-liquid in the liquid storage chamber to the liquid outlet to allow smoking; and
  stopping the first interdigital transducer while keeping the second interdigital transducer to drive a remaining e-liquid of the first e-liquid and the second e-liquid in the flow channel between the second interdigital transducer and the liquid storage chamber to flow into the liquid storage chamber; after the first e-liquid and the second e-liquid in the flow channel between the second interdigital transducer and the liquid outlet flow out and are completely atomized, stopping the second interdigital transducer to complete the smoking.

15. The electronic cigarette liquid supply method according to claim 14, wherein, the first interdigital transducer, the liquid storage chamber, the second interdigital transducer, the flow channel and the liquid outlet are linearly arranged relative to one another.

16. The electronic cigarette liquid supply method according to claim 14, wherein, a thickness of the insulating film is 200 nm-400 nm; a width of the flow channel is 5-11 times a wavelength of the traveling surface acoustic wave of the first interdigital transducer and is 5-11 times a wavelength of the traveling surface acoustic wave of the second interdigital transducer; a depth of the flow channel is 2-5 times the wavelength of the traveling surface acoustic wave of the first interdigital transducer and is 2-5 times the wavelength of the traveling surface acoustic wave of the second interdigital transducer; and a width of the liquid outlet is 1 mm-10 mm, and a height of the liquid outlet is 0.1 mm-1.0 mm.

17. The electronic cigarette liquid supply method according to claim 14, wherein, an input signal used by the first interdigital transducer and an input signal used by the second interdigital transducer have one frequency, and the one frequency ranges from 100 MHz to 400 MHz.

18. The electronic cigarette liquid supply method according to claim 14, wherein, the first interdigital transducer and the second interdigital transducer are both gate electrodes formed by sputtering two metal films; a first metal film of the two metal films is made of titanium or chromium and has a thickness of 30 nm-100 nm; and a second metal film of the two metal films is made of aluminum or gold and has a thickness of 100 nm-300 nm.

19. The electronic cigarette liquid supply method according to claim 14, wherein, the piezoelectric substrate is at least one selected from the group consisting of quartz, a silicon wafer deposited with a zinc oxide film, piezoelectric ceramics, lithium niobate and lithium tantalite; the piezoelectric substrate has a thickness of 0.3 mm-1.5 mm, a temperature coefficient of $-100 \times 10^{-7}/°$ C.$-30 \times 10^{-6}/°$ C., and an electromechanical coupling coefficient of 3.5%-8.5%; a propagation speed of the traveling surface acoustic wave of the first interdigital transducer on the piezoelectric substrate and a propagation speed of the traveling surface acoustic wave of the second interdigital transducer on the piezoelectric substrate are both 3950 m/s-4005 m/s.

20. The electronic cigarette liquid supply method according to claim 14, wherein, the liquid storage chamber and the flow channel are both made of polydimethylsiloxanes.

* * * * *